United States Patent
Bourgoin et al.

(10) Patent No.: US 9,502,659 B2
(45) Date of Patent: Nov. 22, 2016

(54) CARBON NANOTUBE FIELD EFFECT TRANSISTOR

(75) Inventors: Jean-Philippe Bourgoin, Voisin le Bretonneux (FR); Marcelo Goffman, Palaiseau (FR); Vincent Derycke, Montigny le Bretonneux (FR); Nicolas Chimot, Brunehamel (FR)

(73) Assignee: COMMISSARIAT A L'ENERGIE ATOMIQUE, Paris (FR)

(*) Notice: Subject to any disclaimer, the term of this patent is extended or adjusted under 35 U.S.C. 154(b) by 1991 days.

(21) Appl. No.: 11/893,673

(22) Filed: Aug. 16, 2007

(65) Prior Publication Data

US 2008/0296563 A1 Dec. 4, 2008

(30) Foreign Application Priority Data

May 31, 2007 (FR) .................. 07 55391

(51) Int. Cl.
- H01L 51/00 (2006.01)
- B82Y 10/00 (2011.01)
- H01L 51/05 (2006.01)

(52) U.S. Cl.
CPC .......... *H01L 51/0048* (2013.01); *B82Y 10/00* (2013.01); *H01L 51/0003* (2013.01); *H01L 51/0545* (2013.01); *H01L 51/0525* (2013.01); *H01L 51/0558* (2013.01)

(58) Field of Classification Search
USPC ............ 257/E51.04, 341, 342; 977/936, 750
See application file for complete search history.

(56) References Cited

U.S. PATENT DOCUMENTS

| | | | |
|---|---|---|---|
| 6,392,271 B1 * | 5/2002 | Alavi et al. | 257/328 |
| 7,211,464 B2 * | 5/2007 | Lieber et al. | 438/99 |
| 2004/0023514 A1 | 2/2004 | Moriya et al. | 438/778 |

FOREIGN PATENT DOCUMENTS

WO WO2006/075968 7/2006

OTHER PUBLICATIONS

A. Dodabalapur : "Organic and polymer transistors for electronics", Materials today, vol. 9 No. 4, 24 (2006).
V. Wagner et al. : "Megahertz operation of organic field-effect transistors based on poly(3-hexylthiophene)", Applied Physics Letters vol. 89 No. 24, 243515 (2006).
B. Yoo et al.: "Organic complementary D flip-flops enabled by perylene diimides and pentacene", Institute of Electrical and Electronics Engineers Electronic Device Letters vol. 27 No. 9, 737 (2006).
R. Rotzoll et al.: "Radio frequency rectifiers based on organic thin-film transistors", Applied Physics Letters vol. 88 No. 12, 123502 (2006).

(Continued)

*Primary Examiner* — Laura Menz
*Assistant Examiner* — Candice Y Chan
(74) *Attorney, Agent, or Firm* — Davidson, Davidson & Kappel, LLC

(57) ABSTRACT

A nanotube-based flexible field effect transistor and its method of manufacture is provided. The field effect transistor according to the invention comprises at least two contact electrodes, respectively drain and source electrodes, an electrical conduction zone connected to the contact electrodes, said zone comprising a plurality of single-wall carbon nanotubes that are substantially aligned, a gate electrode for controlling the electric current circulating in said zone and a flexible substrate on which the contact and gate electrodes are deposited. The nanotube density in the conduction zone is strictly greater than 10 nanotubes per micrometer.

17 Claims, 6 Drawing Sheets

(56) References Cited

OTHER PUBLICATIONS

E. Cantatore et al.: "A 13.56-MHz RFID system based on organic transponders", IEEE Journal of Solid-State Circuits vol. 42 No. 1, 84 (2007).

Y. Sun et al.: "Gigahertz operation in flexible transistors on plastic substrates", Applied Physics Letters vol. 88 No. 18, 183509 (2006).

J. H. Ahn et al.: "High-speed mechanically flexible single-crystal silicon thin-film transistors on plastic substrates", IEEE Device Letters vol. 27 No. 6, 460 (2006).

Q. Cao et al.: "Highly bendable, transparent thin-film transistors that use carbon-nanotube-based conductors and semiconductors with elastomeric dielectrics", Advanced Materials vol. 18, 304 (2006).

J. Vaillancourt et al.: "High-speed thin-film transistor on flexible substrate fabricated at room temperature", Electronic Letters vol. 42, 1365 (2006).

Kang et al.: "High-performance electronics using dense, perfectly aligned arrays of single walled carbon nanotubes", Nature Nanotechnologies (Mar. 25, 2007).

Durkop et al: "Extraordinary Mobility in Semiconducting Carbon Nanotubes," Nano Lett 2004; 4(1); 35-39.

J.M. Bethoux et al.: "An 8-GHz fT carbon nanotube field-effect transistor for gigahertz range applications", Institute of Electrical and Electronics Engineers Electronic Device Letters vol. 27 No. 8, 460 (2006).

M. S. Arnold et al.: "Sorting carbon nanotubes by electronic structures using density differentiation", Nature Nanotechnology vol. 60, 60 (2006).

G. Zhang et al.: "Selective etching of metallic carbon nanotubes by gas-phase reaction", Science vol. 314, 274 (2006)).

S. Auvray et al: "Carboon Nanotube transistor optimization by chemical control of nanotube-metal interface," (Nano Letters, 5 (3): 451-455 Mar. 2005).

J. Borghetti et al: "Optoelectronic Switch and Memory Devices Based on Polymer Functionalized Carbon Nanotube Transistors," (Advanced Materials, 18 (19): 2535-+Oct. 4, 2006).

Kang et al.:"High-Performance electronice using dense, perfectly aligned arrays of single-walled carbon nanotubes," Nature Nanotechnology, vol. 2, Mar. 25, 2007, pp. 230-236.

Nagahara et al.:"Direct placement of suspended carbon nanotubes for nanometer-scale assembly," Applied Physics Letters, Aip, American Institute of Physics, Melville, NY, US, vol. 80, No. 20, May 20, 2002.

Auvray et al.:"Chemical Optimization of Self-Assembled Carbon Nanotube Transistors," Nano Letters, ACS, Washington, DC, US, vol. 5, No. 3, Mar. 2005, pp. 451-455.

Borghetti et al.: "Optoelectronic Switch and Memory Devices Based on Polymer-functionalized Carbon Nanotube Transistors," Advanced Materials, No. 18, 2006, pp. 2535-2540.

Rutherglen et al., "Nanotube electronics for radiofrequency applications," Nature Nanotechnology, vol. 4, p. 811-819, Nov. 29, 2009.

Tang et al., "New Confinement Method for the Formation of Highly Aligned and Densely Packed Single-Walled Carbon Nanotube Monolayers," Small 6, pp. 1488-1491, 2010.

* cited by examiner

CARBON NANOTUBE FIELD EFFECT TRANSISTOR

This claims the benefit of French Patent Application No. 07/55391, filed on May 31, 2007, the entire disclosure of which is hereby incorporated by reference herein.

FIELD OF THE INVENTION

The present invention relates to a carbon nanotube-based flexible field effect transistor and its method of manufacture.

BACKGROUND

Flexible electronics is a field of research in rapid expansion, driven by high hopes for novel applications such as electronic journals, RFID (Radio Frequency Identification Tags) type data transmission tags, or reconfigurable displays. A review of these potential applications is described in the article "Organic and polymer transistors for electronics" (A. DODABALAPUR Materials today, volume 9 No. 4, 24 (2006).

A solution widely used in the flexible electronics field has for a long time consisted of using polymers such as Poly (p-phenylenevinylene) PPV or Poly(3-hexylthiophene) P3HT and small organic molecules of the pentacene or rubrene type.

The article "Megahertz operation of organic field-effect transistors based on poly(3-hexylthiophene)" (V. WEIGNER et al.—Applied Physics Letters volume 89 No. 24, 243515 (2006)) describes a field effect transistor with a poly(3-hexylthiophene) polymer film channel with a unity gain frequency of 2 MHz, the mobility of charges in this polymer being limited to 0.2 cm2/V.s.

In addition, the article "Organic complementary D flip-flops enabled by perylene diimides and pentacene" (B. YOO et al.—Institute of Electrical and Electronics Engineers Electronic Device Letters volume 27 No. 9, 737 (2006) describes the manufacture of a complementary D flip-flop electronic device including organic CMOS semiconductor transistors. The n and p type organic semiconductors used are, respectively, N,N'-bis(n-octyl)-dicyanoperylene-3, 4:9, 10-bis(dicarboximide) (PDI-8CN2) and pentacene. The devices presented operate at a clock speed of 5 kHz. Transistors in PDI-8CN2 and in pentacene have very low mobilities (6.3.10-2 and 0.29 cm2/V.s respectively) and, in addition, operate under very high electrical bias voltages (+100 and −100 volts respectively).

By way of example, the article "Radio frequency rectifiers based on organic thin-film transistors" (R. ROTZOLL et al.—Applied Physics Letters volume 88 No. 12, 123502 (2006) may also be cited, which presents a power rectifier utilizing P-MIS (Metal Insulator Semiconductor) type transistors with a semiconductor layer of pentacene on a polyethylenenaphthalate substrate operating up to 20 MHz, the mobility of the charges in the pentacene layer being less than 0.3 cm2/V.s.

In addition, the article "A 13.56-MHz RFID system based on organic transponders" (E. CANTATORE et al.—IEEE Journal of Solid-State Circuits volume 42 No. 1, 84 (2007) presents a radio frequency identification device constructed on a flexible sheet of polyimide operating at 13.56 MHz, the mobility of charges being estimated at 10-2 cm2/V.s.

Thus it is observed that in spite of the large efforts undertaken, the relatively low mobility of charges in these materials (10-3-10 cm2/V.s) very strongly limits applications with high frequencies of operation.

A solution to allow applications with a higher frequency of operation consists of utilizing semiconductor nanowires and ribbons, which are materials that also enable flexible electronic devices to be made.

Thus, the article "Gigahertz operation in flexible transistors on plastic substrates" (Y. SUN et al.—Applied Physics Letters volume 88 No. 18, 183509 (2006) describes a device on a poly(ethylenetherephthalate) plastic substrate based on GaAs semiconductor wires with an operation frequency of 1.55 GHz. The authors demonstrate that these devices operate in tension and in compression up to levels of approximately 0.71% (which corresponds to a radius of curvature of 14 mm). The current comes back to its initial value when the constraints are released. Under constraints greater than 1%, the devices undergo irreversible damage which, according to the authors, is very likely caused by a rupture in the wires or gate electrodes. The angles of curvature reached in this work therefore remain modest, which constitutes a strong limitation for the conceivable applications.

In addition, the article "High-speed mechanically flexible single-crystal silicon thin-film transistors on plastic substrates" (J. H. AHN et al.—IEEE Device Letters volume 27 No. 6, 460 (2006) describes transistors on a plastic (polyimide) substrate for which the active part consists of single crystal silicon ribbons. The continuous (DC) and high frequencies responses of the devices reveal a mobility of 500 cm2/V.s and an operation frequency that reaches 515 MHz. In addition, its operation in flexion is stable up to 3 mm radii of curvature. However, as for devices based on organic polymers and materials, the relatively low mobility of the charges in silicon also limits the potential applications at high frequency.

More recently, research in the field of flexible electronics has also been devoted to the use of carbon nanotubes.

Several studies have been devoted to the static performances of flexible transistors utilizing carbon nanotubes. In these studies, the authors associate a study of the electrical characteristics of the device when it is under tension and/or compression constraints. As an example, the article "Highly bendable, transparent thin-film transistors that use carbon-nanotube-based conductors and semiconductors with elastomeric dielectrics" (Q. CAO et al.—Advanced Materials volume 18, 304 (2006) may be cited. This article describes transistors obtained by transfer of different layers of single-wall carbon nanotubes on a sheet of poly(ethyleneterephthalate). These devices support flexions up to a level of approximately 2% with recovery of the initial transconductance and current level characteristics when the constraints are removed. However, only static performance is described in the case of this device and high frequency applications are not proposed.

More recently, the article "High-speed thin-film transistor on flexible substrate fabricated at room temperature" (J. VAILLANCOURT et al.—Electronic Letters volume 42, 1365 (2006) described the design of a thin film transistor of carbon nanotubes on a flexible substrate operating around 150 MHz at low electrical bias voltage (VDS=2 V). In this work, the nanotubes are deposited in the form of films by the spin coating technique. Here, the nanotubes are deposited in a disorganized manner, which strongly limits the high frequency performances.

In addition, the article "High-performance electronics using dense, perfectly aligned arrays of single walled carbon nanotubes" (KANG et al.—Nature Nanotechnologies—25 Mar. 2007) described a growth method for self-aligned (versus "deposited in a disorganized manner" as described in the previous paragraph) nanotubes on a rigid crystal substrate and the utilization of this method to manufacture flexible devices by transfer of nanotubes from the rigid growth substrate to a flexible substrate.

Therefore, the implementation of the method according to the article "High-performance electronics using dense, perfectly aligned arrays of single walled carbon nanotubes" also poses some difficulties.

The major disadvantage of this method resides in obtaining a low mobility of the components (on the order of 480 cm2/V.s). This low mobility does not enable high frequency work on the flexible substrate.

SUMMARY OF THE INVENTION

An object of the present invention is to provide a field effect transistor free of the aforementioned problems allowing utilization in the flexible electronics field at high operation frequency.

In accordance with an embodiment of the present invention a field effect transistor includes at least two contact electrodes, drain and source electrodes respectively. An electrical conduction zone is connected to said contact electrodes, said zone including a plurality of single wall carbon nanotubes that are substantially aligned. A gate electrode is provided for the control of the electrical current circulating in said zone. A flexible substrate is also provided on which said contact and gate electrodes are deposited. The density of nanotubes in said construction zone of the transistor is strictly greater than 10 nanotubes per micrometer.

In this respect, the nanotube density is understood to refer to the number of nanotubes divided by the width of the conduction zone.

The high density of aligned nanotubes associated with the exceptional flexibility of these nanotubes and the very significant mobility of the charges propagating in carbon nanotubes (up to 105 cm2/V.s according to the article "Extraordinary Mobility in Semiconducting Carbon Nanotubes" (Durkop et al, Nano Lett 2004; 4(1); 35-39) allows field effect transistors that are both flexible and that present considerably improved frequency performances to be obtained.

A large density of aligned carbon nanotubes presents two advantages for high frequency measurements:

First, it allows the device to be matched in impedance to the 50Ω impedances of conventional measuring equipment. In fact, an individual carbon nanotube has a minimum resistance of 6.5 kΩ due to its one-dimensional character and the number of transmission modes, even when it is connected ohmically. In other words, a device designed from a single nanotube would reflect the largest part of the high-frequency power injected, leading to a low signal-to-noise ratio at high frequency. Thanks to the high density of nanotubes used, the DC impedance of the device is close to 50Ω.

Second, it allows the parasitic capacitance per carbon nanotube to be reduced. In fact, as the width of the electrodes connecting the nanotubes is several orders of magnitude larger than the typical diameter of a nanotube (between 1 and 3 nm), parasitic capacitances have a dramatic impact on high-frequency performance when a single nanotube (or a low density of nanotubes) is utilized. By increasing the number of nanotubes within a given geometry, the relative impact of these capacitances is markedly reduced.

The transistors according to the embodiments of the present invention may allow extrinsic frequencies of operation greater than 500 MHz, on the order of 1 GHz, to be reached. In the rest of the description, data called "extrinsic" refers to the as-measured data. Data called "intrinsic" refers to the "extrinsic" measurements from which the influence of the metallic pads and electrodes utilized to connect the devices to the measurement probes was subtracted. Their influence is obtained through structures identical to the devices measured but which do not include carbon nanotubes. This correction method is known to HF (High Frequency) measurement specialists and is designated in English by the term "de-embedding". By applying this method to the transistors according to the invention, intrinsic frequencies on the order of 8.4 GHz are reached (a utilization at a higher intrinsic frequency (on the order of 30 GHz) is also attainable).

In addition, the transistors according to the embodiments of the present invention may enable radii of curvatures of less than 3 mm (on the order of 1.5 mm) to be reached with stable electric performance.

The transistor according to the embodiments of the present invention may also present one or more of the characteristics below, considered individually or according to all technically possible combinations:
 The density of nanotubes is preferentially greater than or equal to 100 nanotubes per micrometer,
 The gate electrode includes a dielectric coating such as an aluminum oxide, said coating presenting a thickness tox and a relative permittivity Er verifying the condition Er/tox>0.2 (with, for example, tox substantially equal to 2 nm and Er substantially equal to 8 such that ∈r/tox is substantially equal to 4).
 The width of the electrical conduction zone is less than 800 nm,
 According to a first embodiment, the gate electrode is partially overlapped by a source electrode and/or a drain electrode, the width of the overlapping being less than or equal to 100 nm,
 According to a second embodiment, the gate electrodes and the contact electrodes do not present any overlap; in this case, the nanotubes situated in the zone separating the gate electrode and the contact electrodes are doped in such a way as to make them conductive; advantageously, the gate electrode then includes a dielectric coating such as an aluminum oxide presenting a thickness tox and a relative permittivity ∈r verifying the condition ∈r/tox greater than 2.
 The nanotubes are single-wall carbon nanotubes presenting a diameter between 0.8 and 2.5 nm and preferably between 1.2 and 1.6 nm,
 The layer of nanotubes forming the conduction zone has a thickness of less than or equal to 5 nm,
 The layer of nanotubes forming the conduction zone substantially is a monolayer of nanotubes,
 The flexible substrate is a PET (Poly-ethyleneterephtalate) type transparent substrate.
 The gate electrode is situated under the conduction zone in such a way that said conduction zone is accessible.

According to one embodiment of the present invention, the gate electrode includes two fingers in the extension of a common contact, the transistor according to the invention including:
 Two source electrodes,
 Two conduction zones including a plurality of substantially aligned nanotubes, each of said zones connecting one of the source electrodes with the drain electrode and each of the fingers respectively controlling the electric current circulating in one of said conduction zones.

More generally, the gate electrode may also include a plurality of gate fingers each controlling the electric current circulating in a conduction zone including a plurality of substantially aligned nanotubes, the transistor including as many source electrodes as gate electrode fingers, said source electrodes being interconnected.

Another object of the present invention is to provide a method of manufacturing a transistor according to the invention, including a step of depositing nanotubes made by a dielectrophoresis method, including the following steps:
- Deposition of a drop of solvent in which a plurality of single-wall nanotubes are dispersed,
- Application of an alternating electric field between two contact electrodes.

The method according to embodiments of the present invention may also present one or more of the characteristics below, considered individually or according to all technically possible combinations:
- in the special case of a transistor with two gate electrode fingers and two source electrodes, the electric field is applied between the two source electrodes,
- each of the electrodes is manufactured by electron-beam lithography, said production including the following steps:
  - the deposition of at least one resist layer (for example a PMMA (polymethyl methacrylate) type resist) on the flexible substrate,
  - annealing said resist layer,
  - deposition of a layer of metal absorbing only a small part of the electrons from the electron beam and with a thickness of less than 10 nm,
  - exposure to the electron beam to make the electrode pattern,
  - removal of said metal layer,
  - development of the resist,
  - deposition of the metallic material to make the electrodes,
  - removal of the resist,
- advantageously, deposition of the PMMA type resist layer is preceded by the deposition of a first layer of an MMA (methyl methacrylate) type resist,
- advantageously, the layer of metal absorbing only part of the electron beam is a layer of aluminum,
- according to a particularly advantageous embodiment, the gate electrode is made of aluminum, the method includes a step of oxidizing the gate electrode according to the following steps:
  - exposure of the aluminum electrode to an oxygen gas,
  - annealing said electrode for a duration sufficient to make an aluminum oxide coating (materials whose relative permittivity $\in r$ is close to 8) on a thickness tox of less than 20 nm (guaranteeing $\in r/tox>0.4$) and, for example, substantially equal to 2 nm (guaranteeing $\in r/tox>4$).

The method according to embodiments of the present invention may also include a prior step of depleting the metallic nanotubes from the drop of solvent initially containing an undifferentiated mixture of metallic and semiconducting nanotubes, the depletion being done by repeating several successive steps of dielectrophoresis.

The method according to embodiments of the present invention may also include a step of destroying the metallic nanotubes included in the plurality of substantially aligned nanotubes.

In the case where the gate electrode and the contact electrodes do not present any overlapping, doping of the nanotubes situated in the zone separating the gate electrode and the contact electrodes may be carried out according to one of the following methods:
- Carrying out a chemical treatment allowing the conductivity of the nanotubes located in the zone separating the gate electrode and the contact electrodes to be improved,
- Carrying out a deposition of molecules or of a polymeric layer on the nanotubes located in the zone separating the gate electrode and the contact electrodes; advantageously, the molecules or the polymeric layer are photosensitive in such a way that the conductivity of the nanotubes is improved by illumination.

BRIEF DESCRIPTION OF THE DRAWINGS

FIG. 1 (b) schematically represents an enlarged top view of the field effect transistor represented in FIG. 1 (a);

FIG. 1 (c) is an image by atomic force microscopy showing the carbon nanotubes of the field effect transistor represented in FIGS. 1 (a) and (b);

FIG. 3 (b) represents the extrinsic and intrinsic current gain of a transistor according to the invention as a function of the frequency (VDS=−700 mV and VGS=0 V).

DETAILED DESCRIPTION

Figure 1:
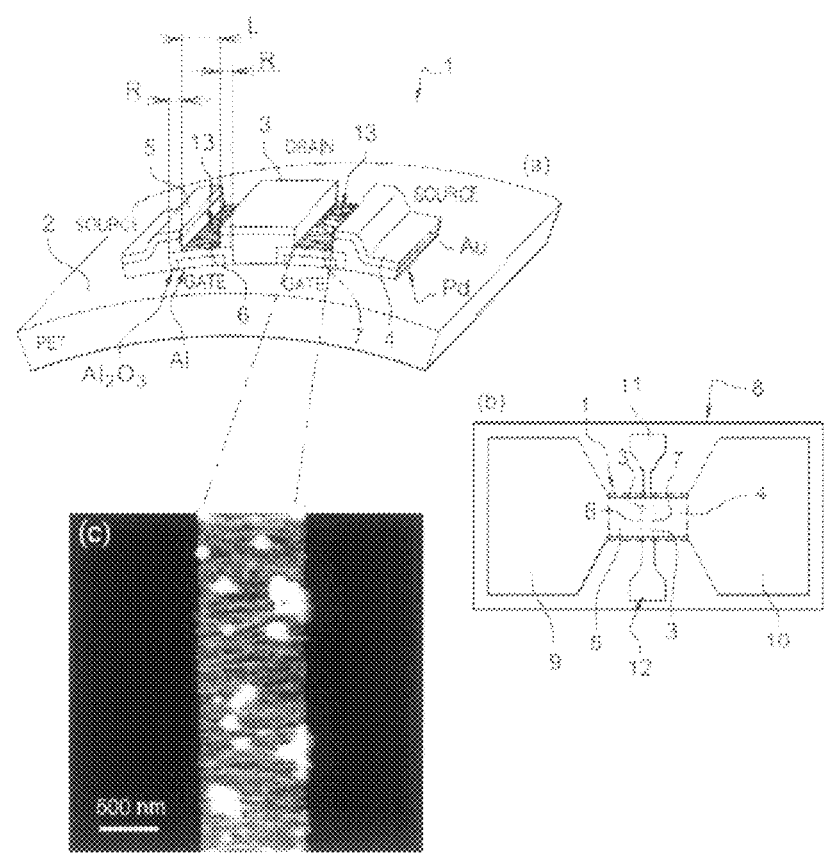
FIG. 1 (a) is a simplified schematic representation of a field effect transistor according to the invention.

FIG. 1 (a) is a simplified schematic representation of a field effect transistor 1 according to the invention. We will cover the manufacturing of this transistor 1 later with reference to FIGS. 5 to 11. Transistor 1 includes:
- A transparent poly(ethyleneterephthalate) (PET) flexible substrate 2 with a thickness of 250 µm,
- A first metallic source electrode 5,
- A second metallic source electrode 4,
- A drain electrode 3,
- Two gate fingers 6 and 7.

Each of the metallic contact electrodes (drain and source) 3, 4 and 5 includes a first layer of palladium overlapped by a second layer of gold. However, it will be noted that the metals cited here are given here by way of example; other metals (or metal alloys) such as Ti, Al, Cr, Cu, Pt or Co may also be utilized. In addition, we have described a flexible PET substrate but other types of flexible substrates such as polyesters, polyimides (KAPTON . . . ), polydimethylsiloxane (PDMS) or polydimethylsiloxane may also be utilized. The utilization of a transparent substrate may prove to be interesting in the case of certain applications, for example those necessitating illumination of the device through its rear face or those incorporating devices emitting light (such as electronic journals, for which the electronics may possibly be found at the back of the page read).

Each of the gate fingers 6 and 7 have a width of 1 µm and is made of aluminum with a thickness on the order of 50 nm. Of course, this width is given by way of example. Gate fingers 6 and 7 are overlapped by a dielectric layer of aluminum oxide (Al2O3) with a low thickness (on the order of 2 nm). The utilization of a thin dielectric layer of high permittivity (on the order of 8 for aluminum oxide) allows an excellent gate control quality to be obtained. The result is that a low polarization of the gate is sufficient to control the transistor. It should be noted that such a thin oxide increases the parasitic capacitance at the level of the source-gate and drain-gate overlaps, as will be defined later. Parasitic capacitances limit the high frequency performance so that a compromise on the thickness of the oxide is to be found. It is possible that the highest frequency is not obtained for the thinnest oxide. This remark also applies to the relative permittivity. The best compromise may not correspond to the highest permittivity.

In addition, according to the embodiment described here, the dielectric utilized is aluminum oxide, but other dielectrics may also be utilized; by way of example, metal oxides (such as TiO2 or Ta2O5 for example) or other materials such as SiO2 or insulating polymers may be cited. In the latter cases, they are deposited above a metallic gate electrode by the implementation of methods known to the person skilled in the art.

The Al2O3 dielectric layer is overlapped by carbon nanotubes 13; these carbon nanotubes are single-wall nanotubes with diameters preferably between 1.2 and 1.6 nm. These nanotubes are substantially aligned between a source electrode 5 or 4 and the drain electrode 3 in such a way as to form two conduction zones (respectively between the source 5 and the drain 3 and between the source 4 and the drain 3) also call the transistor channel. Each of the conduction zones presents a width L, here equal to approximately 800 nm.

The nanotube density is greater than 10 nanotubes per micrometer and preferably greater than 100 nanotubes per micrometer. As we could verify on the image of a part of the gate finger obtained by atomic force microscopy from FIG. 1 (C), the dielectrophoresis method utilized to deposit these nanotubes (to which we will return later) allows a very high carbon nanotube density to be obtained with a very high degree of alignment. The irregularities visible on the image are not impurities from the nanotube solution. They are due to the initial roughness of the PET substrate. In this connection, the PET substrate may be chosen in such a way as to present the lowest possible roughness (on the order of 10 nm on average for example). As we will observe later, the high density of nanotubes allows transistor 1 to operate at a high frequency.

Static electrical measurements (DC) on a group of devices such as represented in FIG. 1 (*a*) have been carried out and DC currents of several milliamperes (with VDS<700 mV) have been obtained, which confirms the large number of nanotubes involved in the transport.

The thickness of the nanotube layer forming each of the conduction zones is preferably less than 5 nm, the gate control being more effective as the thickness is thinner (the further away from the gate the nanotubes are, the less they are influenced by the gate due to both the distance and the screening of the field by the other nanotubes in-between). Preferentially, the conduction zone is composed of a monolayer of nanotubes (i.e., the average thickness of the layer is substantially equal to the diameter of a nanotube).

As for the gate voltage, the drain-source voltage necessary is also low; this is explained by:

The high density of nanotubes coupled with the high mobility of charges propagating through carbon nanotubes (>105 cm2/V.s versus 1 to 10 cm2/V.s for a polymer), which enables a very significant current with a low electric field to be obtained, The utilization of palladium for source and drain electrodes allows good (quasi-ohmic) electrical contacts with the nanotubes, preventing by this fact a voltage drop at the metal-nanotube junction.

Each of the source electrodes 4 and 5 forms an overlap R on the respective gate oxide of fingers 7 and 6, this overlap substantially measuring 100 nm.

In addition, the drain electrode 3 forms on both sides an overlap R on the gate oxide of fingers 7 and 6, this overlap substantially measuring 100 nm.

The act of taking a short channel width L promotes the rise in frequency.

In addition, a low source-gate and drain-gate overlap R width limits parasitic capacitance (metal-oxide-metal capacitance leading to a cut-off frequency) and thus promotes rises in frequency.

It will be noted that the two gate fingers 6 and 7 are under the nanotubes; such a configuration allows a subsequent treatment, particularly chemical, of the nanotubes. However, a configuration with a gate electrode located above the nanotubes (of the "top-gated nanotube transistor" type) also enters in the scope of the present invention.

By taking the smallest gate finger width (for example 400 nm), and also the smallest overlaps R (for example on the order of 50 nm), conduction zone widths that are advantageously smaller (for example on the order of 300 nm) are obtained.

It is also possible to increase the number of gate fingers; such a configuration allows the total number of carbon nanotubes at constant density to be increased. Thanks to this increase, the quality of the signal is improved (by increasing the total current). To do this, the source electrodes must be interconnected: this connection may be made by utilizing known methods such as those used for device interconnections in conventional microelectronic circuits.

The field effect transistor 1 represented schematically in FIG. 1 (*a*) clearly represents a part of the full transistor 8 such as represented in FIG. 1 (*b*) (see part 1 detailed in FIG. 1 (*b*)). The pattern utilized for the transistor 8 corresponds to a pattern adapted for high frequency measurement according to a known Ground-Signal-Ground (GSG) configuration. Thus, it is observed that the gate electrode fingers 6 and 7 have an extension 12 including a larger size pad 12. It is the same for the source (respectively 5 extended by a port 9 and 4 extended by a pad 10) and drain (3 extended by a pad 11) contact electrodes. These enlarged pads allow high frequency measurements to be made by using three-tipped RF probes.

It will be noted that the GSG configuration requires the presence of two source electrodes to position the three-tipped probes. Thus, transistor 1 such as represented in FIG.

1, by virtue of the presence of two sources and two gate fingers, in reality has the structure of two transistors. Of course, the invention is not limited to a GSG configuration; thus, according to another embodiment, the transistor according to the invention may only have a single source electrode. Another alternative may consist of connecting the two source electrodes.

Figure 2:
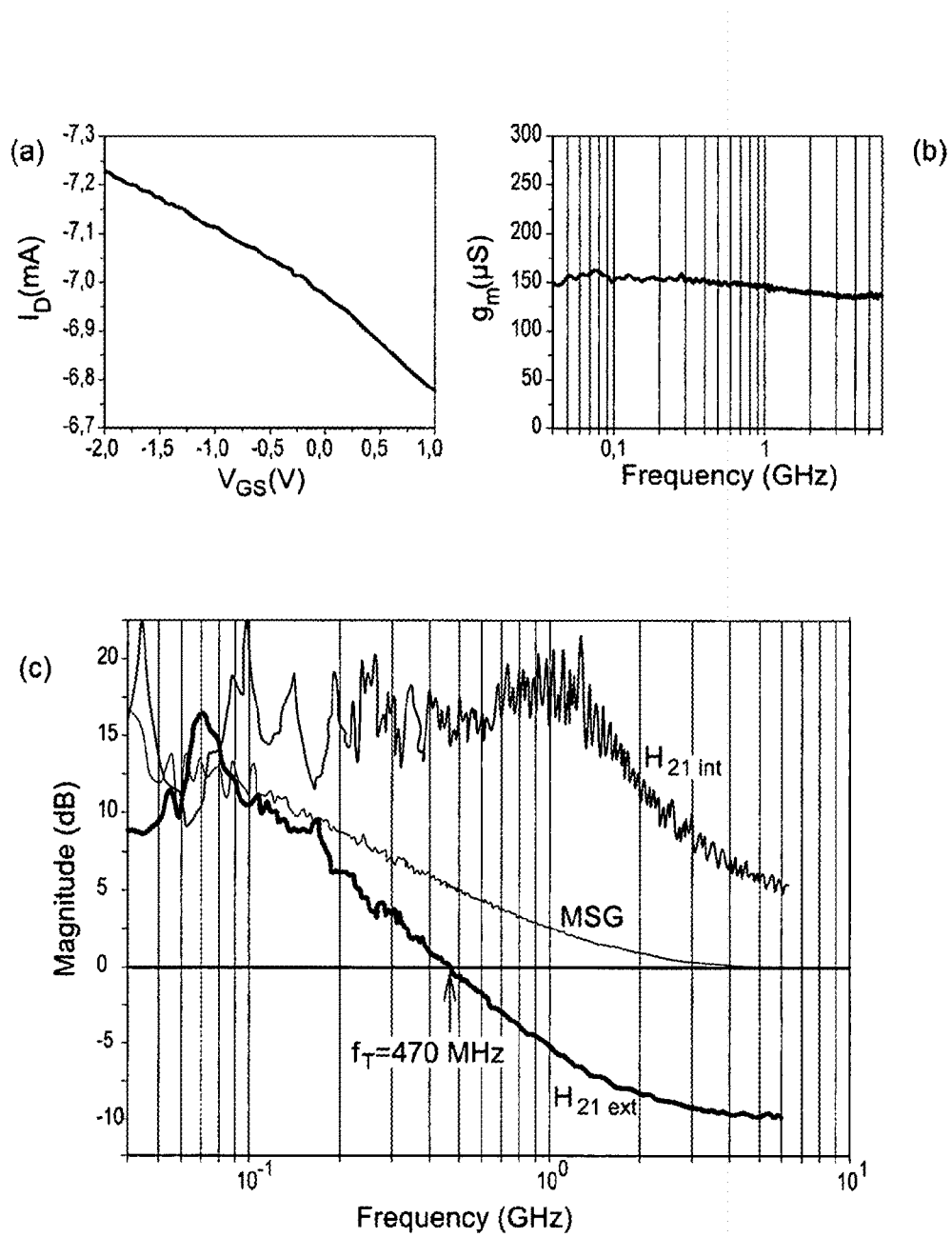
FIG. 2 (a) is a representation of the transfer characteristic at VDS=−600 mV of the transistor as represented in FIGS. 1 (a) and (b), FIG. 2 (b) represents the transconductance as a function of the frequency of the transistor as represented in FIGS. 1 (a) and (b), FIG. 2 (c) represents the evolution of the current gain |H21| with and without decoupling of the parasitic capacitances and of the maximum stable gain (MSG=|S21/S12|) as a function of the frequency at VDS=−600 mV and VGS=0 V.

FIGS. 2 (a) to 2 (c) allow the transistor such as represented in FIGS. 1 (a) to 1 (c) to be characterized electrically; that is, a transistor presenting a nanotube density on the order of 100 nanotubes per micrometer, a conductivity zone width on the order of 800 nm and an overlap R substantially equal to 100 nm.

FIG. 2 (a) presents the transfer characteristic ID=f(VGS) of a transistor according to the invention when the source/drain electrical bias voltage is −600 mV. It clearly indicates the p-type character of the transistor. From the slope of this curve, we deduce a zero gate bias DC transconductance of 150 μS. This excellent transconductance results from the combined effect of:

(i) The deposition method, to which we will return later,
(ii) The gate quality (thin layer of aluminum oxide) and
(iii) The quality of the contacts (in palladium).

High frequency measurements are represented in FIGS. 2 (b) and 2 (c). These high frequency measurements have been carried out by utilizing a Vectorial Network Analyzer (VNA) in a frequency range going from 40 MHz to 6 GHz. From the "scattering" parameters (S parameters), we deduce the dynamic transconductance gm=(|Y21−Y12|), the current gain (|H21|2=|Y21/Y11|2) and its cut-off frequency (fT), and the maximum stable gain (MSG=|S21/S12|). FIG. 2 (b) shows the evolution of the dynamic transconductance gm as a function of frequency. This AC transconductance remains almost constant over the entire frequency range, thus at least up to 6 GHz. This frequency value is only limited by the measurement setup. Its value at 1 GHz is ~143 μS, close to the DC value of 150 μS.

FIG. 2 (c) represents the evolution of the current gain |H21|ext (dB) and of the maximum stable gain (MSG=|S21/S12|) as a function of the frequency. The device is polarized at VDS=−600 mV and VGS=0 V. We can extract from the figure a cut-off frequency of the current gain equal to 470 MHz. The MSG gain is still equal to 2.5 dB at 1 GHz. These two curves demonstrate the excellent aptitudes of these flexible carbon nanotube devices for high frequency operation. We can observe that the current gain and MSG gain slopes are respectively equal to −17 dB/dec and −7 dB/dec. Deviations of these values with relation to theoretical values (−20 dB/dec and −10 dB/dec) may be attributed to the influence of the extrinsic parts of the device. In fact, the cut-off frequency fT is mainly limited by the parasitic capacitance resulting from overlaps between the gate and the source and between the source and the drain. The influence of these capacitances may be eliminated by utilizing a structure known as an "open" structure, strictly identical to the structure measured, but without carbon nanotubes. This is a de-embedding procedure that simply consists of subtracting the admittance parameters (Y parameters) of the "open" structure from those of the measured structure (for further information on the method, the person skilled in the art may refer to the article "An 8-GHz fT carbon nanotube field-effect transistor for gigahertz range applications" (J. M. BETHOUX et al.—Institute of Electrical and Electronics Engineers Electronic Device Letters volume 27 No. 8, 460 (2006)). FIG. 2 (c) presents the intrinsic current gain |H21_int| resulting from the decoupling procedure. By utilizing a slope at −20 dB/dec, we deduce an intrinsic cut-off frequency equal to approximately 8.4 GHz.

Figure 3:
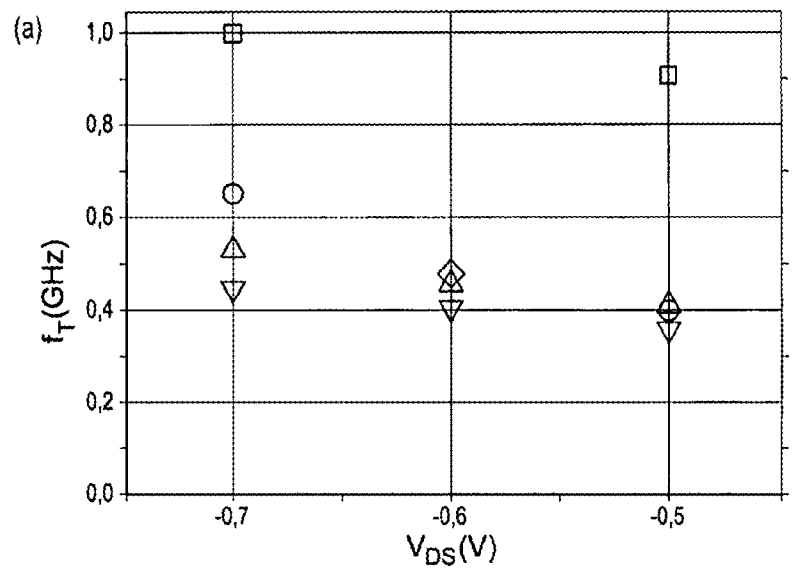
FIG. 3 (a) represents the current-gain cut-off frequency fT as a function of the voltage VDS for several transistors according to the invention.
Figure 3:
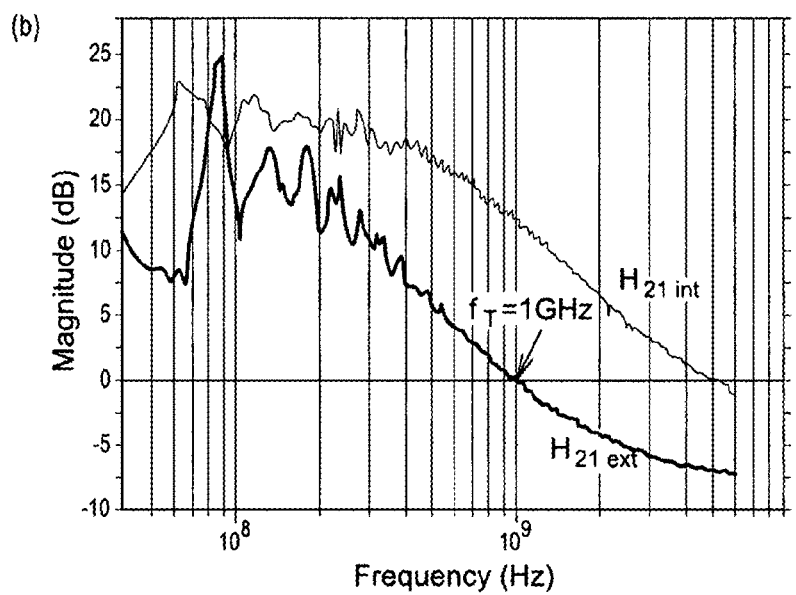

FIG. 3 (a) represents the cut-off frequency of the current gain fT as a function of the voltage VDS for several devices according to the invention on different chips. In the range of VDS voltage studied, fT linearly increases with VDS, which directly reflects the increase in transconductance. The applicant limited the measurements to a voltage VDS=−700 mV in order to not damage the gate oxide. Variation in fT from one device to another in the 400 MHz to 1 GHz range is observed.

The extrinsic and intrinsic current gains as a function of frequency for the fastest (1 GHz) corresponding device are represented in FIG. 3 (b) for a voltage VDS=−700 mV and VGS=0 V.

To summarize, the transistors according to the invention allow operation at extrinsic frequencies on the order of GHz (corresponding to corrected intrinsic frequencies that can reach 8.4 GHz).

As we mentioned previously, these measurements were obtained for a transistor presenting a nanotube density on the order of 100 nanotubes per micrometer, a conductivity zone width on the order of 800 nm and a source/gate and drain/gate overlap R that is substantially equal to 100 nm. However, it is entirely possible and advantageous to take smaller gate finger widths and overlaps R, thus forming smaller conduction zone widths. In addition, nanotube density may be increased. For example, a configuration with a gate finger width on the order of 400 nm and overlaps R on the order of 50 nm, provide conduction zone widths on the order of 300 nm that may allow intrinsic frequency values fT on the order of 30 GHz to be reached.

Figure 4:
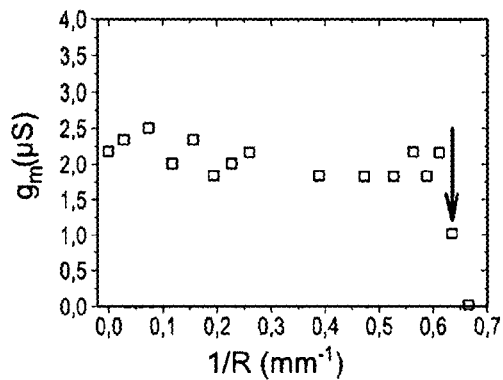
FIG. 4 represents the evolution of the transconductance in continuous current at VDS=50 mV as a function of the flexion.

FIG. 4 represents the DC transconductance evolution (at VDS=50 mV) according to the flexion (the unit in abscissa is the inverse of the radius of curvature) in order to illustrate the performance of transistors according to the invention when they are subject to mechanical constraints. During the first flexion cycles, the applicant observed a reduction in DC transconductance when flexions exceeded 0.3 mm−1 (that is, a radius of curvature of less than 3.3 mm). This reduction certainly corresponds to the progressive disconnection of carbon nanotubes that initially were poorly connected by the electrodes. However, after several cycles, the flexion performance is stabilized and remains constant even after several cycles under flexions corresponding to radii of curvature as small as approximately 1.5 mm. It is noted that the transconductance remains constant up to 0.6 mm−1 before finally dropping to zero while the current flowing in the device at VGS=0 V remains unchanged. This last situation very likely indicates a rupture in the gate electrode. A manner of improving the rupture threshold may consist of constructing mixed metal-nanotubes based electrodes in such a way as to take maximum advantage of nanotube flexibility. In parallel, monitoring the evolution of the current between the source and the gate on the one hand and between the drain and the gate on the other hand allowed the absence of significant gate leakage current to be observed, which indicates the absence of rupture in the gate oxide.

FIGS. 5 to 11 illustrate the different steps in the manufacturing method according to the invention.

Each of these FIGS. 5 to 11 represents on the left part, a top view of the device according to the invention at each step of the method and on the right part, a partial enlarged cross-sectional view according to line II-II of the part framed in dots of the same device.

Figure 5:
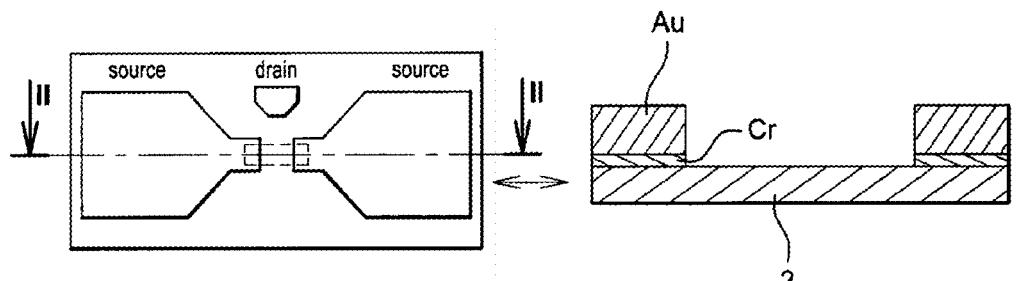
FIGS. 5 to 11 illustrate the different steps of the manufacturing method according to the invention, FIGS. 12 (a) to 12 (d) illustrate the different steps of the lithography method utilized during the manufacturing method according to the invention.

According to FIG. 5, the first step consists of carrying out a first electron-beam lithography to deposit metal source and drain contacts according to a Ground-Signal-Ground (GSG) configuration already described above on the PET substrate 2. These metal contacts include a layer of chromium Cr overlapped by a layer of gold Au.

The different steps of the lithography method utilized during the manufacturing method according to the invention are illustrated in FIGS. 12 (*a*) to 12 (*d*).

According to FIG. 12 (*a*), each of the lithographies undertaken during the development of the devices requires the preliminary deposition of three layers: a first layer of MMA (methyl methacrylate) resist is deposited at the spinner with a rotation speed of 4000 rotations/minute for 1 minute. Air annealing on a hot plate at 120° C. is carried out for 5 minutes. Preferentially, the temperature must not exceed 120° C. so as to not damage the PET substrate 2. Similarly, a second layer of PMMA (polymethyl methacrylate) is then deposited. A new annealing is carried out at 100° C. for 30 minutes. Lastly, a third thin layer of aluminum (typically on the order of 5 to 10 nm) is deposited by evaporation. This layer is very important for performing electronic lithography on an insulating substrate such as PET since it allows charges to be evacuated during irradiation by the electron beam. A too-thick layer may prevent the passage of electrons. It is noted that aluminum is particularly suitable inasmuch as it absorbs few of the beam electrons. In addition, it is noted that it is also possible to use a single layer of PMMA resist.

According to FIG. 12 (*b*), as the three layers are deposited, electron beam lithography is performed. Before developing the resist, the layer of aluminum is removed by chemical etching (in a KOH solution).

According to FIG. 12 (*c*), after development, 5 nm of chromium and 50 nm of gold are deposited in such a way as to form metal source contacts that are represented here by way of example (the drain contact is formed in an identical manner).

According to FIG. 12 (*d*), the resist is then removed in acetone heated to approximately 50° C. ("lift-off" step). The "lift-off" step consists of removing the resist by dissolution and to only keep the metal layers on the parts in direct contact with the substrate.

Thus, the metal contacts represented in FIG. 5 including a layer of chromium Cr overlapped by a layer of gold Au are obtained by the implementation of the lithography method such as described above.

Figure 6:
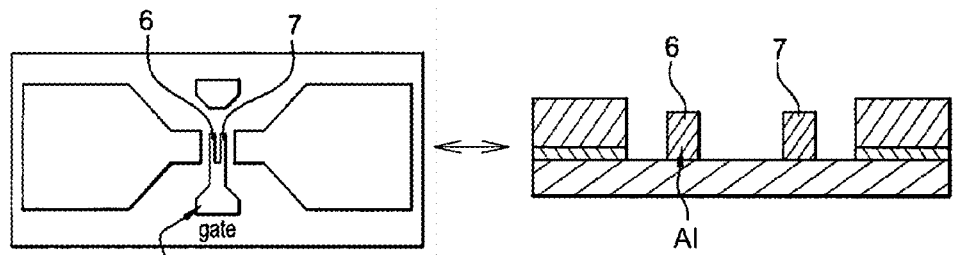

According to FIG. 6, by utilizing an electronic lithography method similar to that described previously, the two gate electrode fingers 6 and 7 in aluminum as well as the pad 12 with dimensions greater in their extensions are deposited. The gate fingers 6 and 7 are 1 µm wide. A thickness of 50 nm of aluminum is thus deposited under a vacuum of less than $5.10^{-6}$ torr (this value is given for indication purposes, but it is also possible to work under higher vacuums).

Figure 7:
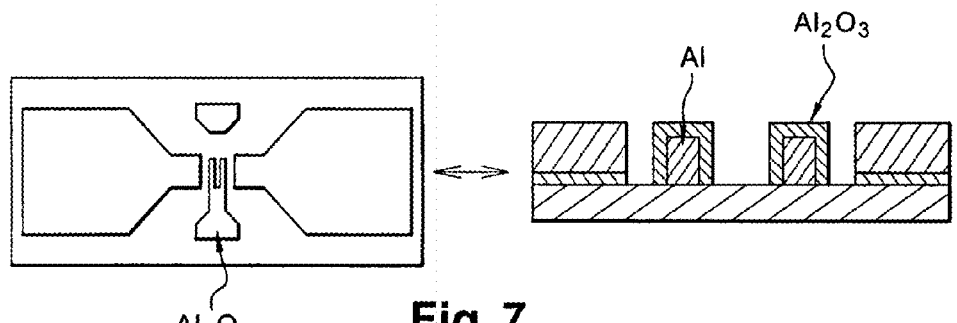

According to FIG. 7, the gate fingers 6 and 7 are then exposed to pure oxygen gas at a pressure of 20 mbar for 20 minutes. The assembly is finally air annealed at 120° C. for 2 hours (this annealing allows the oxygen to be diffused and the Al2O3 coating to be created). As the resist has been removed, the invention proceeds to a new air annealing on a hot plate at 120° C. in order to ensure oxidation of the vertical walls of the gate fingers. This oxidation method allows a coating of aluminum oxide of approximately 2 nm in thickness to be obtained. As already mentioned above, the utilization of this thin, high permittivity coating allows an excellent gate control quality to be obtained. As also explained above, it is also possible to utilize other methods (deposition for example) to obtain a dielectric gate coating.

Figure 8:
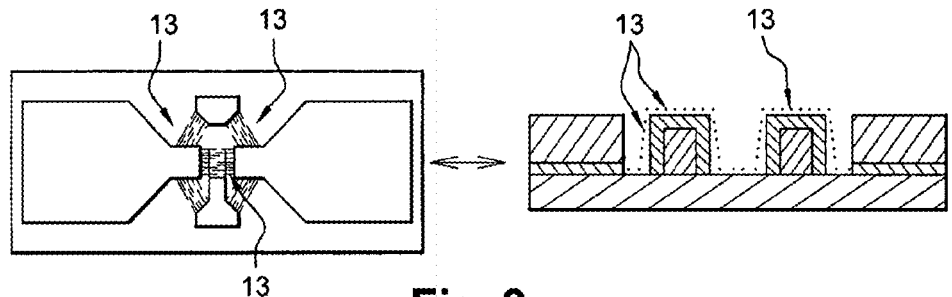

According to FIG. 8, the carbon nanotubes 13 are deposited by a dielectrophoresis method. The carbon nanotubes 13 utilized are single-wall nanotubes with diameters preferentially between 1.2 and 1.6 nm. The dielectrophoresis method allows the density and alignment of the carbon nanotubes to be optimized. To do this, a 3 µL-drop of N-methylpyrolidone solvent in which single-wall carbon nanotubes are dispersed (at a concentration of 5 mg/L) is deposited on the assembly of the device. An alternating electric field with an amplitude of 10 V (+at −5V) at a frequency of 15 MHz is then applied between the two source electrodes separated by 7 µm. Guided by this electric field, the carbon nanotubes 13 are deposited between the metallic electrodes and on the dielectric Al2O3 layers. Carrying out deposition in this step and then overlapping the tubes from an extension (subsequently also known as "making contact") of the source and drain electrodes (as will be described later) presents two advantages:

(i) The metal-nanotube electrical contacts are better when the metal is deposited over the nanotubes and, (ii) If the deposition is carried out with low spacing between the electrodes (such as 800 nm obtained after reconnection), this would impose constraints on the peak electric field utilizable. In fact, a field of 10 V would tend to break the nanotubes during their deposition if the source-drain distance was less than the typical length of the nanotubes utilized (here on the order of one micrometer).

It should be noted in passing that the nanotubes are aligned not only between the source electrodes but also between each of the source electrodes and the drain electrode: in fact, the floating potential of the drain also leads to the presence of an electric field between each of the source electrodes and the drain electrode. This dielectrophoresis method allows a very high density of carbon nanotubes to be obtained with a very high degree of alignment. The nanotube density may be adjusted by regulating the deposition parameters (solution concentration, voltage, deposition duration). Thus, depositions as dense as 100 to 1000 nanotubes per micrometer may be made. The nanotubes are aligned according to the electric field lines; thus, the more nanotubes deposited, the more these nanotubes will tend to short-circuit the electrodes between them: such a mechanism will lead to a reduction in the electric field and an autolimitation of the dielectrophoresis method. Consequently, the utilization of the method allows relatively thin thicknesses of nanotube layers to be obtained. Furthermore, the nanotubes are deposited much better on the surface of the dielectric than on themselves. Consequently, the nanotubes will tend to fill in the entire available surface before creating an additional nanotube layer. For the two reasons cited previously, the dielectrophoresis method substantially allows a monolayer of nanotubes to be obtained.

As explained previously, the presence of two source electrodes is dictated by the GSG configuration for HF measurement; in the presence of a single source electrode, it is entirely possible to create a nanotube-based conductivity zone that is substantially aligned by directly applying an electric field between the source electrode and the drain electrode.

In addition, it will be noted that the drop of solvent includes an undifferentiated mixture of metallic and semiconducting nanotubes. It is possible to use a metallic nanotube-depleted drop. This drop is made by repeating several successive dielectrophoresis steps on different devices: the principle consists of depleting the metallic nanotubes from the drop of solvent during a first high-frequency deposition on a first device by promoting the deposition of metallic nanotubes before semiconducting nanotubes. This step is repeated several times by utilizing the same drop, whose metallic tube depletion increases. Therefore, by utilizing the drop after several depletion steps on the final transistor, it is possible to increase the ratio between semiconducting nanotubes and metallic nanotubes. The increase of this ratio will allow a much more effective off-state to be obtained. Another way to proceed may consist of utilizing a metallic nanotube breakdown technique: by increasing the source-drain bias voltage while applying an appropriate gate bias, a high current can be passed through the metallic nanotubes causing their breakdown. The gate bias is used to set the semiconducting nanotubes in their insulating states so that they are protected from the breakdown process. A chemical treatment aiming to destroy the metallic nanotubes first and foremost and to stop the operation before the semiconducting nanotubes are destroyed may also be used. For further information on these techniques for separating nanotubes by type (metallic/semiconducting), the person skilled in the art may, for example, refer to the article "Sorting carbon nanotubes by electronic structures using density differentiation" (M. S. ARNOLD et al.—Nature Nanotechnology volume 60, 60 (2006) or to the article "Selective etching of metallic carbon nanotubes by gas-phase reaction" (G. ZHANG et al.—Science volume 314, 274 (2006))).

Figure 9:
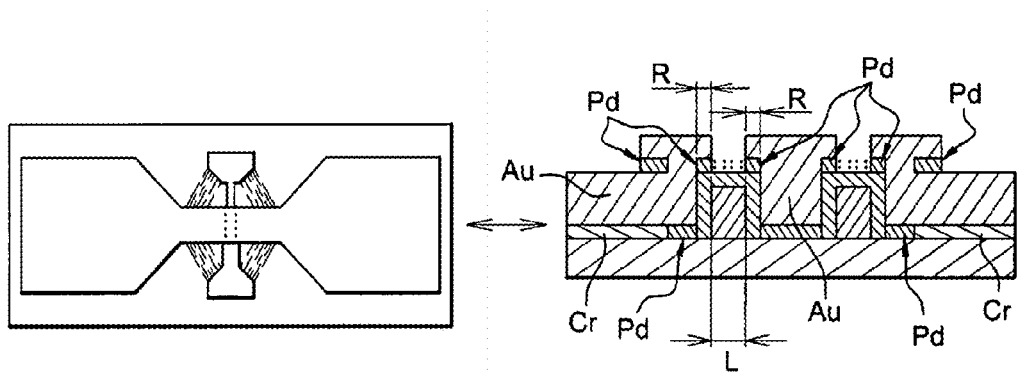

According to FIG. 9, after nanotube deposition, source and drain contacts are made (10 nm of palladium and 45 nm of gold). Overlaps R between the gate and the source on the one hand and between the gate and the drain on the other hand extend over 100 nm. The source-drain channel therefore measures L=800 nm (as a reminder, the gate fingers are 1 μm wide).

Figure 10:
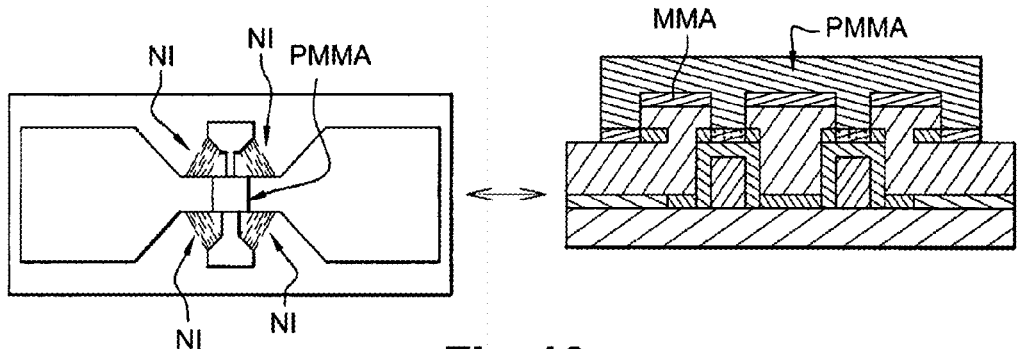

According to FIG. 10, undesirable nanotubes NI deposited directly between the gate and the source and between the drain and the source are destroyed by etching with oxygen ions through a resist mask. The mask deposition conditions are the following:

first deposition of MMA resist at 3000 rotations/min. for 60 seconds then,
annealing at 120° C. for 2 minutes then,
second deposition of PMMA resist at 4000 rotations/min. for 60 seconds then,
annealing at 120° C. for 15 minutes.

The undesirable nanotubes are then destroyed by ionic etching (the ionic etching conditions are 130 μbar of O2 with an accelerating voltage of 130 volts for 1 min 40).

Figure 11:
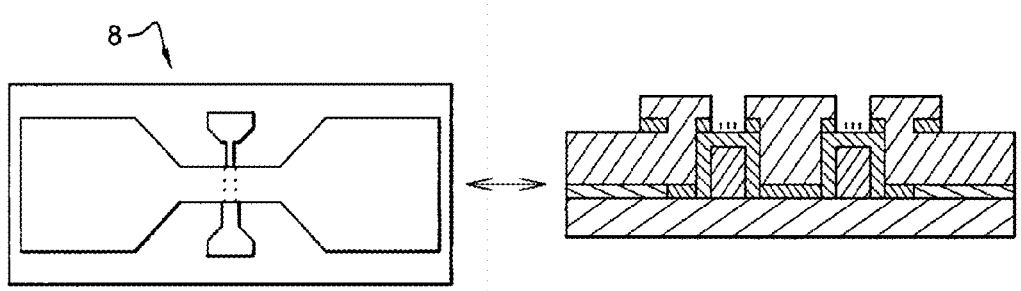
Figure 12A:
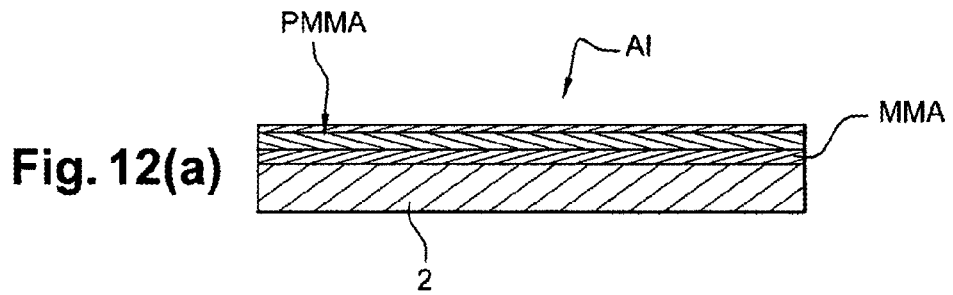
Figure 12B:
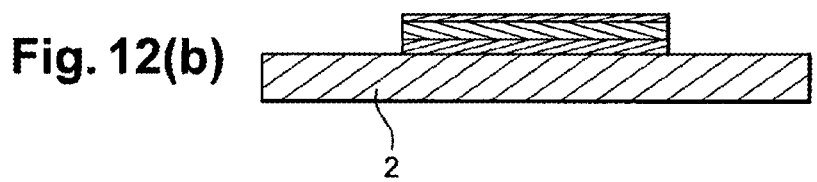
Figure 12C:
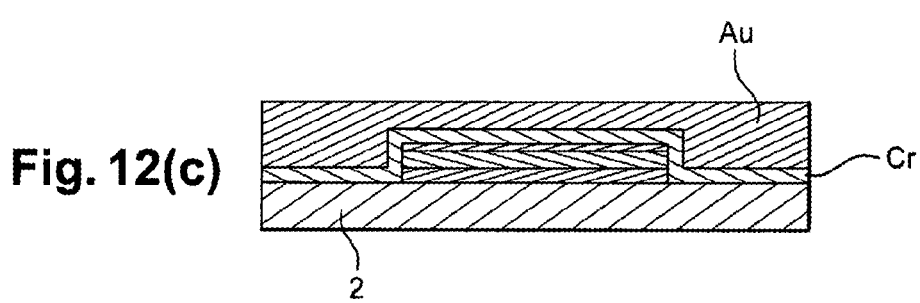
Figure 12D:
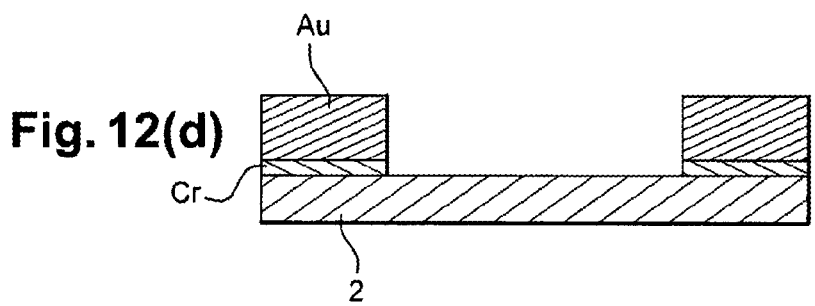

FIG. 11 represents the transistor 8 according to the invention after removal of MMA and PMMA resists (for example, in acetone heated to approximately 50° C.). This transistor 8 is identical to that presented in FIG. 1 (b).

Figure 13:
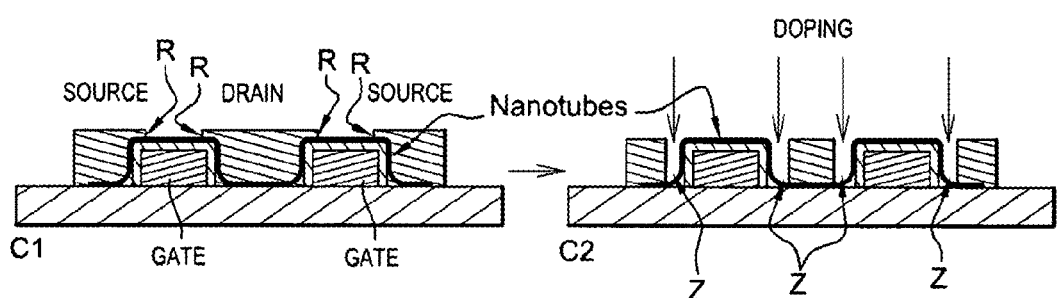
FIG. 13 illustrates a particular embodiment of a transistor according to the invention.

As mentioned previously, a small source-gate and drain-gate overlap R width limits parasitic capacitances and thus improves the high frequency performances. Consequently, an absence of overlap R allows the transistor to rise higher in frequency. A way of proceeding consists of slightly moving the source and drain electrodes apart so that there is no more overlapping with the gate. FIG. 13 illustrates the passage from configuration C1 with an overlap (such as that represented in FIG. 1 (a)) to configuration C2 without an overlap. The transistor according to configuration C2 thus includes zones Z equipped with nanotubes, the zones Z separating the source and drain electrodes from the gate electrode. By doing this, switching performance is lost since the nanotube parts situated in these Z zones are no longer controlled by the gate and are therefore insulated (or are poorly conducting). To compensate for this disadvantage, doping of these nanotube parts (or of the nanotube assembly) may be carried out.

Nanotube doping may be, for example, carried out via a chemical treatment allowing nanotube conductivity to be improved For further information, the person skilled in the art may refer to the article by S. Auvray et al. (NANO LETTERS, 5 (3): 451-455 MARCH 2005).

Another way to dope the nanotubes may consist of carrying out a deposition (or grafting) of molecules or a deposition of a polymer film on the nanotubes; for further information, the person skilled in the art may refer to the article by J. Borghetti et al (ADVANCED MATERIALS, 18 (19): 2535-+Oct. 4 2006). It will be noted that these molecules and the polymer film are photosensitive, the deposition then being combined with an illumination step.

It will be noted that the position of the gate under the nanotubes facilitates subsequent treatments, such as the doping methods described above.

In addition, it will be noted that in the absence of an overlap, it is preferable that the gate oxide be as thin as possible (a thickness preferably of less than 4 nm, for example 2 nm).

The invention claimed is:

1. A field effect transistor comprising:
    at least two contact electrodes, the at least two electrodes including at least one drain electrode and at least one source electrode,
    an electrical conduction zone connected to said contact electrodes, said zone comprising a plurality of single-wall carbon nanotubes that are substantially aligned,
    a gate electrode for controlling the electric current circulating in said zone,
    a flexible substrate on which said contact electrodes and said gate electrode are deposited, wherein a nanotube density in said conduction zone is greater than or equal to 100 nanotubes per micrometer.

2. The transistor according to claim 1, wherein said gate electrode comprises a dielectric coating, said coating presenting a thickness $t_{ox}$ and a relative permittivity $\in_r$ such that the $\in_r/t_{ox}$ ratio is greater than 0.2.

3. The transistor of claim 2, wherein the dielectric coating is an aluminum oxide.

4. The transistor according to claim 3, wherein said $\in_r/t_{ox}$ ratio is substantially equal to 4.

5. The transistor according to claim 1, wherein a width (L) of said electrical conduction zone is less than 800 nm.

6. The transistor according to claim 1, wherein said gate electrode is partially overlapped by the source electrode and/or by the drain electrode, an overlapping width (R) being less than or equal to 100 nm.

7. The transistor according to claim 1, wherein said gate electrode and said contact electrodes are not overlapping.

8. The transistor according claim 7, wherein said gate electrode comprises a dielectric coating, said coating presenting a $\in_r/t_{ox}$ ratio greater than 2.

9. The transistor of claim 8, wherein said dielectric coating is an aluminum oxide.

10. The transistor according to claim 7, wherein the nanotubes situated in a zone separating said gate electrode and said contact electrodes are doped.

11. The transistor according to claim 1, wherein said nanotubes are nanotubes with a diameter of between 0.8 and 2.5 nm.

12. The transistor according to claim 1, wherein the nanotubes form a layer in the conduction zone, the layer of nanotubes disposed on the conduction zone having a thickness of less than or equal to 5 nm.

13. The transistor according to claim 1, wherein the nanotube layer deposited on the conduction zone is substantially a monolayer of nanotubes.

14. The transistor according to claim 1, wherein said flexible substrate is a transparent substrate.

15. The transistor of claim 14, wherein the transparent substrate comprises a poly(ethyleneterephthalate) substrate.

16. The transistor according to claim 1, wherein said gate electrode is situated under said conduction zone such that said conduction zone is made accessible.

17. The transistor according to claim 1, wherein said gate electrode comprises two fingers in the extension of a common contact, and wherein the at least one source electrode includes two source electrodes, and wherein the electrical conduction zone includes two conduction zones comprising a plurality of nanotubes that are substantially aligned, each of said zones connecting one of the source electrodes with the drain electrode and each of said fingers respectively controlling the electric current circulating in one of said conduction zones.

* * * * *